US010020308B2

(12) United States Patent
Luan et al.

(10) Patent No.: US 10,020,308 B2
(45) Date of Patent: Jul. 10, 2018

(54) THYRISTOR MEMORY CELL WITH ASSIST DEVICE

(71) Applicant: Kilopass Technology, Inc., San Jose, CA (US)

(72) Inventors: Harry Luan, Saratoga, CA (US); Bruce L. Bateman, Fremont, CA (US); Valery Axelrad, Woodside, CA (US); Charlie Cheng, Los Altos, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days.

(21) Appl. No.: 15/349,978

(22) Filed: Nov. 11, 2016

(65) Prior Publication Data

US 2017/0352665 A1 Dec. 7, 2017

Related U.S. Application Data

(60) Provisional application No. 62/345,203, filed on Jun. 3, 2016.

(51) Int. Cl.
*H01L 29/66* (2006.01)
*H01L 27/102* (2006.01)
*H01L 27/105* (2006.01)
*H01L 29/423* (2006.01)
*H01L 29/74* (2006.01)
*G11C 11/39* (2006.01)
*H01L 27/08* (2006.01)
*H01L 27/108* (2006.01)
*H01L 27/11* (2006.01)

(52) U.S. Cl.
CPC .......... *H01L 27/1027* (2013.01); *G11C 11/39* (2013.01); *H01L 27/0817* (2013.01); *H01L 27/1023* (2013.01); *H01L 27/1052* (2013.01); *H01L 29/42308* (2013.01); *H01L 29/74* (2013.01); *H01L 27/10805* (2013.01); *H01L 27/11* (2013.01)

(58) Field of Classification Search
CPC . H01L 27/1027; H01L 27/1052; H01L 29/74; H01L 29/42308; H01L 27/11; H01L 27/10805
See application file for complete search history.

(56) References Cited

U.S. PATENT DOCUMENTS

| | | | | |
|---|---|---|---|---|
| 6,727,528 B1 * | 4/2004 | Robins | ............. | H01L 21/76229 257/133 |
| 6,756,612 B1 * | 6/2004 | Nemati | ............. | H01L 27/0817 257/133 |
| 6,815,734 B1 * | 11/2004 | Horch | ............. | H01L 21/76224 257/124 |
| 7,195,959 B1 * | 3/2007 | Plummer | ............. | H01L 21/84 257/E21.389 |

(Continued)

*Primary Examiner* — Victor A Mandala
(74) *Attorney, Agent, or Firm* — Aka Chan LLP

(57) ABSTRACT

A vertical thyristor memory array including: a vertical thyristor memory cell, the vertical thyristor memory cell including: a p+ anode; an n-base located below the p+ anode; a p-base located below the n-base; a n+ cathode located below the p-base; an isolation trench located around the vertical thyristor memory cell; an assist gate located in the isolation trench adjacent the n-base wherein an entire vertical height of the assist gate is positioned within an entire vertical height of the n-base.

12 Claims, 6 Drawing Sheets

(56) References Cited

U.S. PATENT DOCUMENTS

| | | | | |
|---|---|---|---|---|
| 7,456,439 B1* | 11/2008 | Horch | ............... | G11C 11/39 |
| | | | | 257/133 |
| 8,576,607 B1* | 11/2013 | Nemati | ............... | G11C 11/39 |
| | | | | 365/105 |
| 8,576,649 B1* | 11/2013 | Nemati | ............... | G11C 7/065 |
| | | | | 365/189.05 |
| 2007/0051973 A1* | 3/2007 | Yamamura | ............... | H01L 27/1027 |
| | | | | 257/146 |
| 2009/0298238 A1* | 12/2009 | Cho | ............... | G11C 11/39 |
| | | | | 438/135 |
| 2016/0093624 A1* | 3/2016 | Luan | ............... | H01L 27/1027 |
| | | | | 257/133 |
| 2016/0379984 A1* | 12/2016 | Luan | ............... | H01L 27/1027 |
| | | | | 257/133 |
| 2017/0229465 A1* | 8/2017 | Luan | ............... | H01L 21/28518 |

* cited by examiner

THYRISTOR MEMORY CELL WITH ASSIST DEVICE

CROSS-REFERENCE TO RELATED APPLICATIONS

This patent application claims the benefit of U.S. patent application 62/345,203, filed Jun. 3, 2016 and is a continuation-in-part of U.S. patent application Ser. No. 15/197,640, filed Jun. 29, 2016, which both are incorporated by reference along with all other references cited in this application.

BACKGROUND OF THE INVENTION

This invention is related to integrated circuit devices and, in particular, to semiconductor-based memory, such as static random access memory (SRAM) and dynamic random access memory (DRAM).

A DRAM is a type of random-access memory that stores a bit of data in a capacitor coupled to a transistor within the integrated circuit. Lithographic scaling and process enhancement may quadruple the number of bits of storage in a DRAM approximately every three years. However, the individual memory cells have become so small that maintaining the capacitance of each cell while reducing charge leakage may significantly limit further reductions in size.

What is needed is a memory unit cell that is smaller than the conventional one-capacitor one-transistor cell, that is readily scalable below 20 nm design rules, that is compatible with standard bulk silicon processing, and that consumes less power, both statically and dynamically.

BRIEF SUMMARY OF THE INVENTION

This invention provides a memory array suitable in which vertical PNPN thyristors are formed in bulk silicon substrate and isolated from each other by a shallow trench of insulating material in one direction and a deeper trench of insulating material in a perpendicular direction. The array of memory cells is arranged in a cross-point grid and interconnected by metal conductors and buried heavily doped layers.

In an embodiment of the present claimed invention, the memory array includes row lines and column lines with anode of thyristor connected to row line, such as bit line, and cathode of thyristor coupled to column line, such as word line. The substrate may be P-conductivity type with N-conductivity type buried layer extending in a first direction to provide a column line. Alternating P-conductivity type and N-conductivity type layers over the buried layer provide the bases of the thyristor, with an upper P-conductivity type layer providing the anode of the thyristor. A conductive layer coupled to the anode of the thyristor extends in a second direction orthogonal to the first direction to provide a row line.

A gate line may be formed in the trench to provide NMOS or PMOS transistors to assist write speed of adjacent thyristor memory cell.

In an embodiment, the gate line may be parallel to a bit line.

In an embodiment, the gate line may be parallel to a word line.

In an embodiment, the gate line may include an NMOS transistor.

In an embodiment, the gate line may include a PMOS transistor.

In an embodiment, the gate line may be shared by two adjacent thyristor memory cells.

In an embodiment, the gate line may be self-aligned.

In an embodiment, the gate line may be located nearer to one adjacent thyristor memory cell and located farther from the other adjacent thyristor memory cell.

Other objects, features, and advantages of the present invention will become apparent upon consideration of the following detailed description and the accompanying drawings, in which like reference designations represent like features throughout the figures.

DETAILED DESCRIPTION OF THE INVENTION

This invention discloses position of an assist gate relative to an upper edge and a lower edge of a base of a vertical thyristor memory cell in an array.

Figure 1:
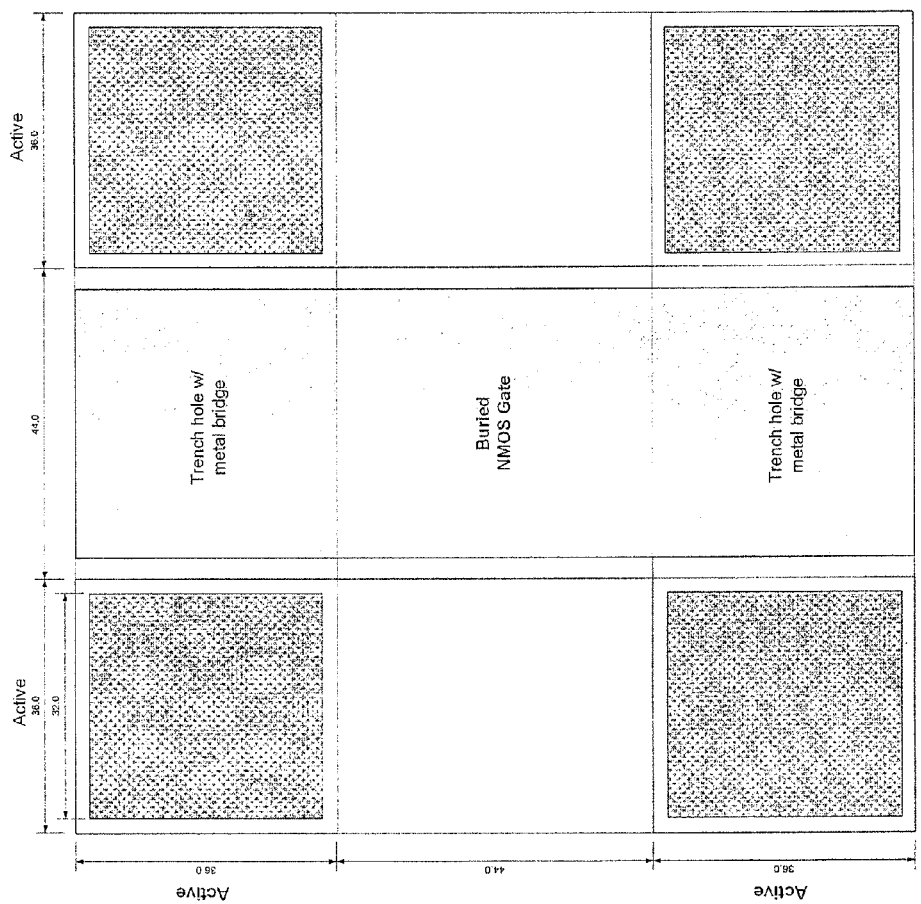
FIG. 1 is a plane view of a layout of a 2×2 vertical thyristor memory cell array as implemented in an integrated circuit according to an embodiment of a claimed invention.

FIG. 1 shows a plane view of a layout of a 2×2 vertical thyristor memory cell array as implemented in an integrated circuit according to an embodiment of a claimed invention.

The four vertical thyristors, including anodes, are located at the corners of the layout. The thyristors are separated in two perpendicular directions with trenches filled with oxide.

A first set of parallel conductive lines provides a word line for each row of the memory array by being coupled to the cathodes of the thyristors in the row. A second set of parallel conductive lines provides a bit line for each column of the memory array by being coupled to the anodes of the thyristors in the column. The word lines are perpendicular to the bit lines.

Figure 4:
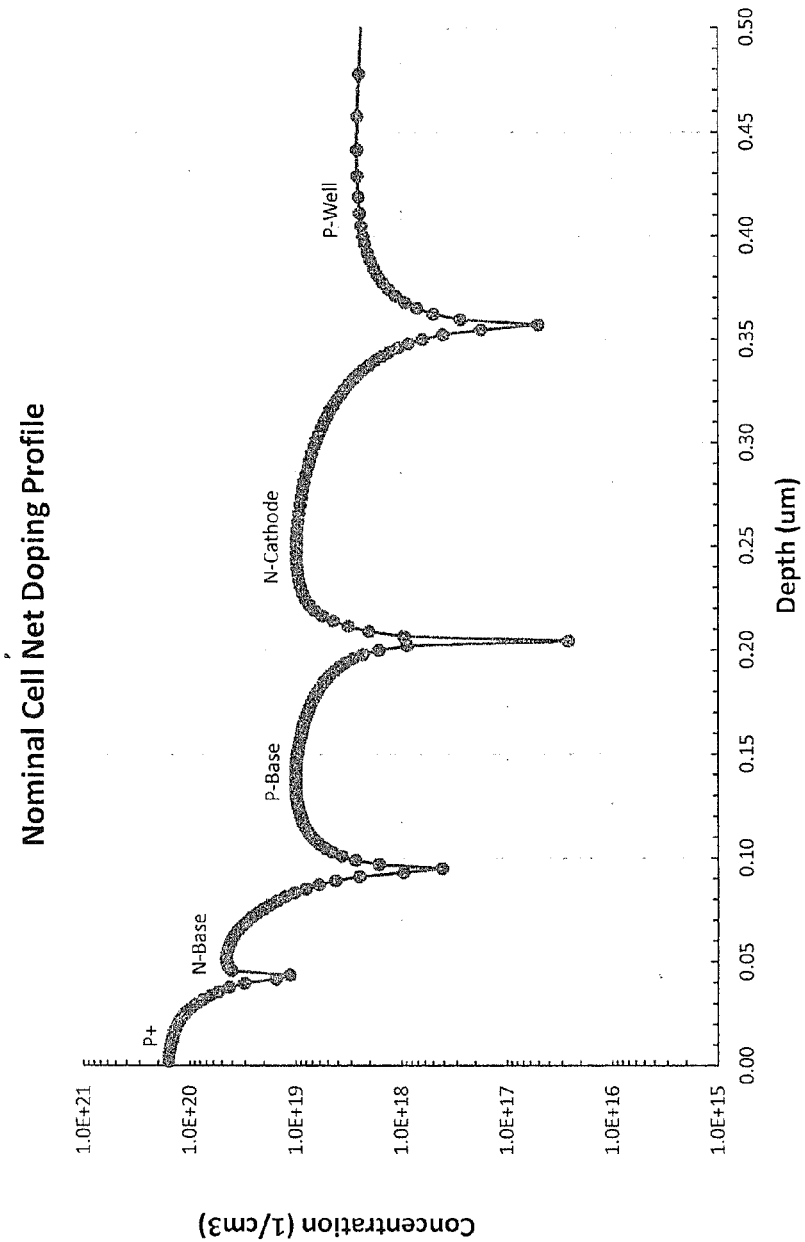
FIG. 4 illustrates doping profile of a vertical thyristor according to an embodiment of a claimed invention.

FIG. 4 shows doping profile of a vertical thyristor according to an embodiment of a claimed invention. The doping concentration varies as a function of depth below the upper surface. In an embodiment of the present claimed invention, some peaks may include a shoulder (not shown). The dose may have a tolerance of +/−6% while the ion implantation energy may have a tolerance of +/−2%.

In an embodiment, an assist device, such as a gate, such as PMOS or NMOS, may be formed next to the sidewalls of the isolation trenches adjacent the thyristor. The assist gates may increase write speed and may reduce write voltage.

The sidewalls of the trench are oxidized, thus forming the gate oxide that isolates the gate electrodes from the doped regions. In an embodiment of the present claimed invention, the gate oxide may have a thickness of 3.0 (+/−0.3) nm.

The trenches are then partially filled with silicon dioxide, such as by a chemical vapor deposition process.

Then a conformal doped-polycrystalline silicon layer is deposited over the structure.

An anisotropic etching step removes the entire conformal polycrystalline silicon layer except for a desired thickness to form a gate (control) line that includes the assist gate.

Then, another trench filling operation is performed to finish filling the trenches.

Planarization steps are then performed, such as by using chemical mechanical polishing or other techniques.

Later, an electrical connection is made to couple the gate (control) lines.

As shown in FIG. 2(a), a PMOS assist gate 80 may be positioned adjacent to the n-base of the vertical thyristor. The PMOS assist gate 80 may run parallel to the word lines (WL) and orthogonal to the bit lines (BL). The word lines may be buried and connected with a conductor in (and through) the isolation trench.

Figure 2:
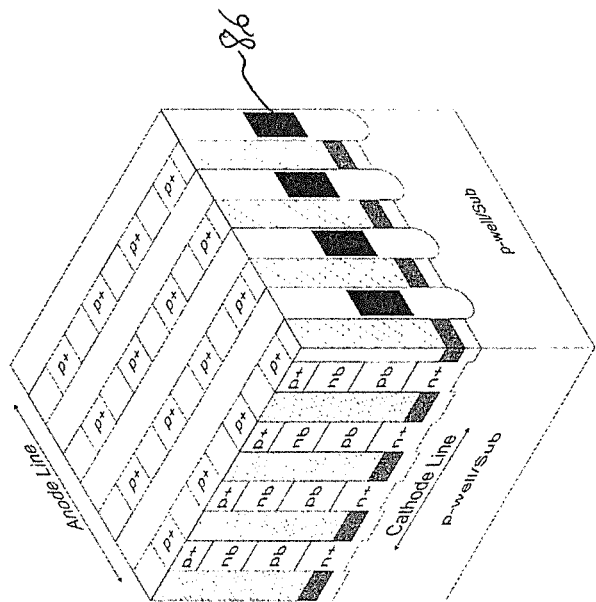
FIG. 2A illustrates a perspective view of perpendicular cross-sections of a vertical thyristor memory cell with a PMOS assist gate parallel to word line according to an embodiment of a claimed invention.
FIG. 2B illustrates a perspective view of perpendicular cross-sections of a thyristor memory cell with an NMOS assist gate parallel to word line according to an embodiment of a claimed invention.
Figure 2:
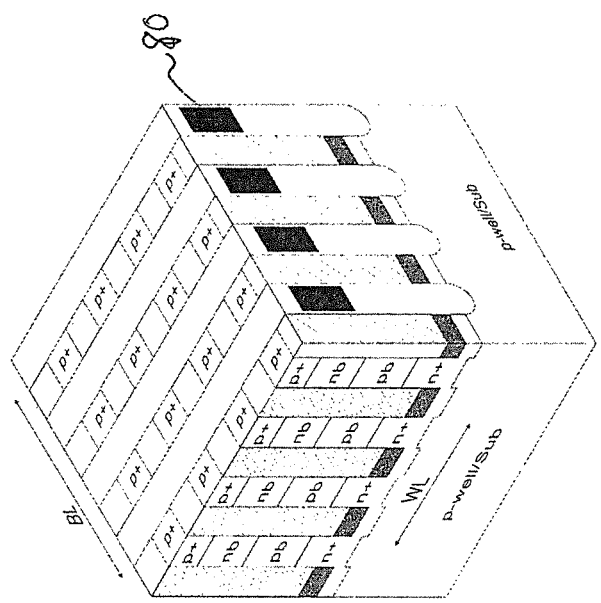

As shown in FIG. 2 (b), an NMOS assist gate 86 may be positioned adjacent to the p-base of the vertical thyristor. The PMOS assist gate 86 may run parallel to the word lines. The word lines may be buried and connected with a conductor in (and through) the isolation trench.

Figure 3:
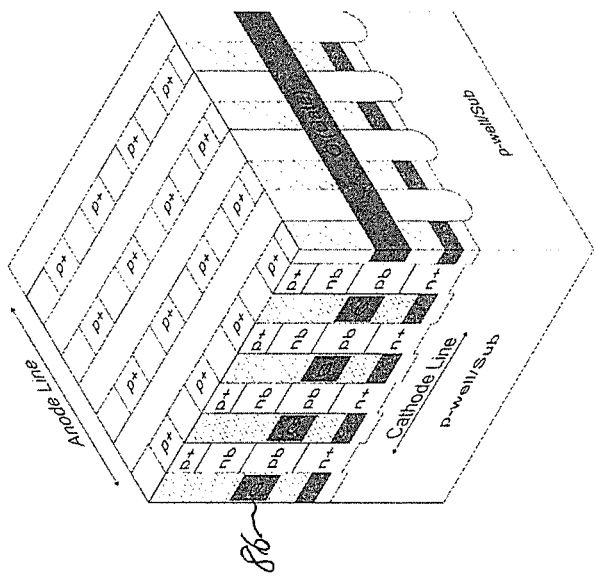
FIG. 3A illustrates a perspective view of perpendicular cross-sections of a vertical thyristor memory cell with a PMOS assist gate parallel to bit line according to an embodiment of a claimed invention.
FIG. 3B illustrates a perspective view of perpendicular cross-sections of a vertical thyristor memory cell with an NMOS assist gate parallel to bit line according to an embodiment of a claimed invention.
Figure 3:
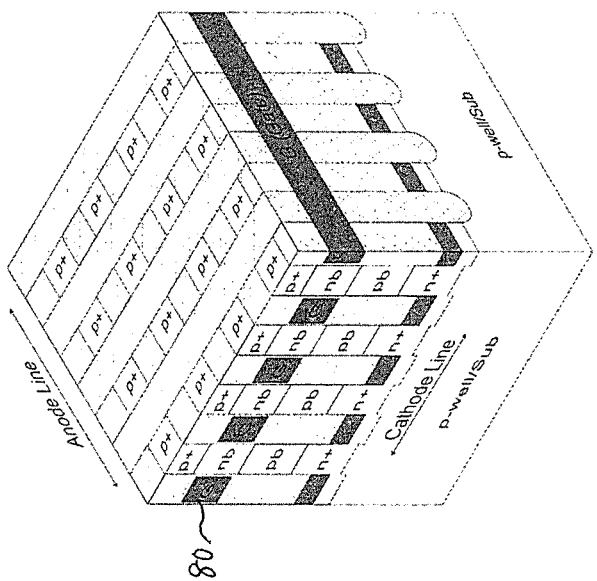

As shown in FIG. 3(a), a PMOS assist gate 80 may be positioned adjacent to the n-base of the vertical thyristor. The PMOS assist gate 80 may run parallel to the bit lines. The bit lines may include an overlying M1.

As shown in FIG. 3(b), an NMOS assist gate 86 may be positioned adjacent to the p-base of the vertical thyristor. The PMOS assist gate 86 may run parallel to the bit lines. The bit lines may include an overlying M1.

In an embodiment of the present claimed invention, the p-base may have a height of 110.0 (+/−11.0) nm.

In an embodiment of the present claimed invention, the NMOS assist gate may have a gate length (vertical height) of 55.0 (+/−5.5) nm.

As shown in an embodiment of the present claimed invention in FIG. 5, an upper edge of the NMOS assist gate (G) may be positioned about 30.5 (+/−3.0) nm below an upper edge of the pbase sPW which in turn underlies sNW.

Figure 5:
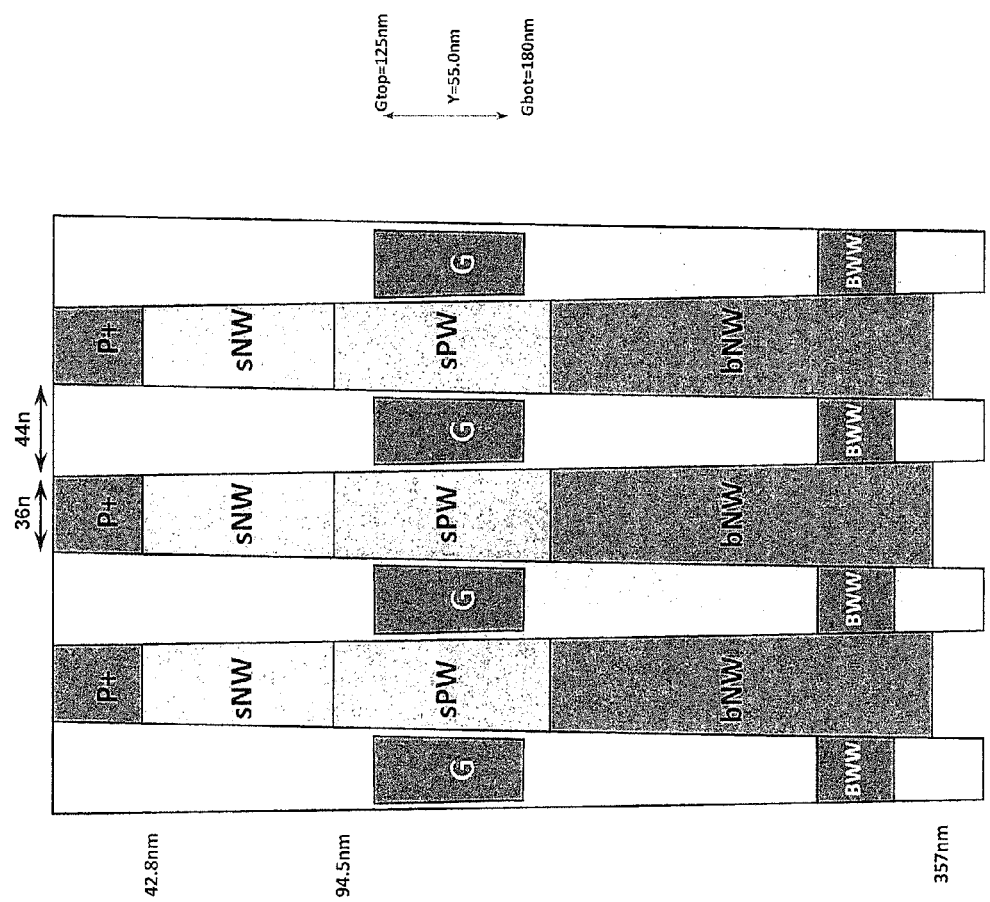
FIG. 5 illustrates cross-section of vertical thyristor with NMOS assist gate located below upper edge and above lower edge of p-base according to an embodiment of a claimed invention.

As shown in an embodiment of the present claimed invention in FIG. 5, a lower edge of the NMOS assist gate may be positioned about 24.5 (+/−2.5) nm above a lower edge of the pbase which in turn overlies bNW.

Figure 6:
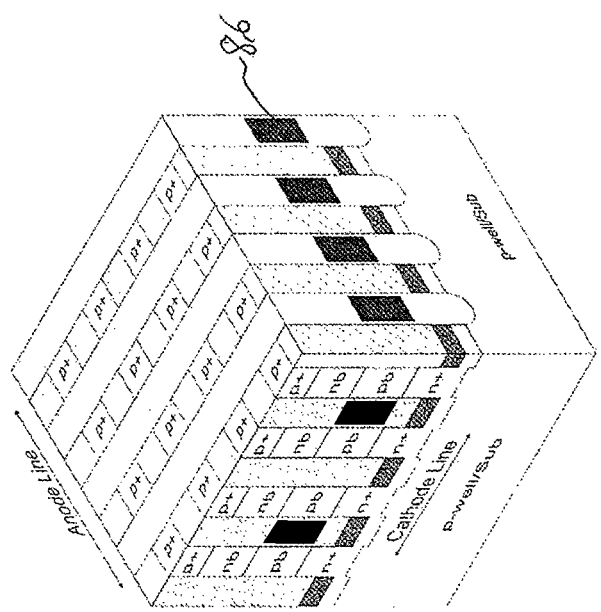
FIG. 6A illustrates a perspective view of perpendicular cross-sections of a vertical thyristor memory cell with a PMOS assist gate completely around the vertical thyristor according to an embodiment of a claimed invention.
FIG. 6B illustrates a perspective view of perpendicular cross-sections of a thyristor memory cell with an NMOS assist gate partially around the vertical thyristor according to an embodiment of a claimed invention.
Figure 6:
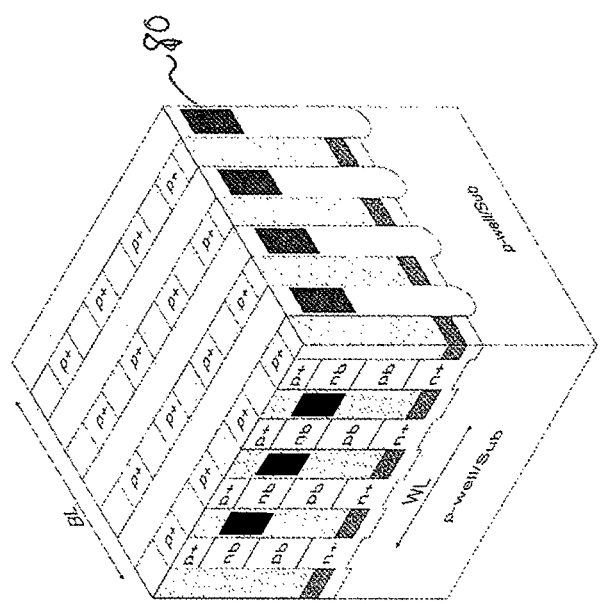

In other embodiments, the assist gates may be formed—partially, in separate segments, or completely—around the vertical thyristor, such as illustrated by FIGS. 6(a) and 6(b).

In other embodiments, the sidewall gates 80, 86 may be formed from other conductive material, such as metal, such as tungsten, or silicide(s), or combinations of different materials.

In an embodiment of the present claimed invention, p+ anodes are connected to bit lines (M1 layer) while n+ anodes are connected to word lines (M2 layer straps between drops for about every 32 vertical thyristors) are connected to N+ cathodes.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A vertical thyristor memory array comprising:
   A vertical thyristor memory cell, the vertical thyristor memory cell comprising:
   a p+ anode;
   an n-base disposed below the p+ anode;
   a p-base disposed below the n-base;
   an n+ cathode disposed below the p-base;
   an isolation trench disposed around the vertical thyristor memory cell;
   an assist gate disposed in the isolation trench around the n-base wherein an entire vertical height of the assist gate is disposed within an entire vertical height of the n-base.

2. The vertical thyristor memory array of claim 1 wherein the assist gate runs orthogonal to the bit lines.

3. The vertical thyristor memory array of claim 2 wherein the assist gate comprises NMOS.

4. The vertical thyristor memory array of claim 1 wherein the assist gate runs parallel to the word lines.

5. The vertical thyristor memory array of claim 1 wherein the assist gate is disposed completely around the n-base.

6. The vertical thyristor memory array of claim 1 wherein the assist gate is disposed partially in segments around the n-base.

7. A vertical thyristor memory array comprising:
   A vertical thyristor memory cell, the vertical thyristor memory cell comprising:
   a p+ anode;
   an n-base disposed below the p+ anode;
   a p-base disposed below the n-base;
   an n+ cathode disposed below the p-base;
   an isolation trench disposed around the vertical thyristor memory cell;
   an assist gate disposed in the isolation trench around the p-base wherein an entire vertical height of the assist gate is disposed within an entire vertical height of the p-base.

8. The vertical thyristor memory array of claim 7 wherein the assist gate comprises PMOS.

9. The vertical thyristor memory array of claim 7 wherein the assist gate runs orthogonal to the bit lines.

10. The vertical thyristor memory array of claim 7 wherein the assist gate runs parallel to the word lines.

11. The vertical thyristor memory array of claim 7 wherein the assist gate is disposed completely around the p-base.

12. The vertical thyristor memory array of claim 7 wherein the assist gate is disposed partially in segments around the p-base.

* * * * *